(12) United States Patent
Pu et al.

(10) Patent No.: US 10,721,445 B1
(45) Date of Patent: Jul. 21, 2020

(54) PROTECTING MIRRORS IN A LASER BEAM SCANNING DISPLAY DEVICE

(71) Applicant: MICROSOFT TECHNOLOGY LICENSING, LLC, Redmond, WA (US)

(72) Inventors: Chuan Pu, Foster City, CA (US); Wenjun Liao, Mountainview, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/589,048

(22) Filed: Sep. 30, 2019

Related U.S. Application Data

(60) Provisional application No. 62/894,643, filed on Aug. 30, 2019.

(51) Int. Cl.
| | |
|---|---|
| *H04N 9/31* | (2006.01) |
| *G02B 26/10* | (2006.01) |
| *G02B 26/08* | (2006.01) |
| *G02B 27/01* | (2006.01) |

(52) U.S. Cl.
CPC ....... *H04N 9/3135* (2013.01); *G02B 26/0833* (2013.01); *G02B 26/105* (2013.01); *G02B 27/0172* (2013.01)

(58) Field of Classification Search
CPC ...... H04N 9/3135; H04N 9/31; H04N 9/3161; G02B 27/0172; G02B 26/101; G02B 26/105; G02B 26/0833
USPC ....... 348/739, 744, 762–764, 767, 768, 770; 345/204; 353/85, 31, 98
See application file for complete search history.

(56) References Cited

U.S. PATENT DOCUMENTS

2014/0078121 A1 * 3/2014 Chikaoka ............... G09G 3/025
345/204

* cited by examiner

*Primary Examiner* — Sherrie Hsia
(74) *Attorney, Agent, or Firm* — Newport IP, LLC; Scott Y. Shigeta; Leonard J. Hope

(57) ABSTRACT

A laser beam scanning ("LBS") display device is configured with an optical system that includes a laser beam emitter configured to emit a laser beam. The optical system also includes a driver configured to generate a driving signal for controlling a mirror, such as a microelectromechanical systems ("MEMS") mirror. The optical system also includes an output limiter configured to limit an amplitude of the driving signal provided to the mirror to a bounded range. The output limiter might be implemented as hardware, software, or a combination of hardware and software.

20 Claims, 14 Drawing Sheets

LBS DISPLAY DEVICE WITH PRE-DRIVER OUTPUT LIMITER

MIRROR CONTROL WITHOUT MIRROR PROTECTION
(PRIOR ART)

LBS DISPLAY DEVICE WITH POST-DRIVER OUTPUT LIMITER

LBS DISPLAY DEVICE WITH HARDWARE OR SOFTWARE CONTROLLER-BASED OUTPUT LIMITER

MIRROR CONTROL WITH MIRROR PROTECTION

MIRROR CONTROL WITH MIRROR PROTECTION
(SMOOTHED OUTPUT LIMITATION FUNCTION)

MIRROR CONTROL WITH
OVERDRIVE, NOISE, AND SHOCK PROTECTION

PROTECTING MIRRORS IN A LASER BEAM SCANNING DISPLAY DEVICE

CROSS-REFERENCE TO RELATED APPLICATIONS

This application claims the benefit of U.S. Provisional Patent Application No. 62/894,643, entitled "Protecting Mirrors in a Laser Beam Scanning Display Device," which was filed on Aug. 30, 2019, and which is expressly incorporated herein by reference in its entirety.

BACKGROUND

Laser beam scanning ("LBS") display devices form displayed images by using mirrors, such as microelectromechanical systems ("MEMS") mirrors, to direct a laser beam onto a display region. In such display devices, the mirrors may move over the course of a frame to control the location in the display region toward which the laser beam is directed. Some LBS displays use two mirrors, a fast-scan mirror that scans under resonance and a slow-scan mirror that scans linearly.

Mirrors used by LBS display devices are susceptible to electrical noise, mechanical noise, and physical shock that can damage the mirrors in certain circumstances. Additionally, a mirror control system might overdrive mirrors to meet certain control targets. This is particularly true for slow-scan mirrors, as they require a mirror control system to suppress the natural resonance of the mirror and quickly correct for external disturbances. As an unintended consequence of these processes, however, the mirror control system might overdrive a mirror, which can force a mirror into very high angles or very fast acceleration and damage the mirror.

Mirror control systems might also overdrive a mirror during startup of a LBS display device. For example, a mirror control system might drive a mirror to its maximum allowable acceleration in order to realize a fast start of an LBS display device. During this process, the mirror control system outputs a mirror drive signal having the largest possible amplitude. This, however, can overdrive a mirror past its maximum allowable displacement, thereby damaging the mirror.

The disclosure made herein is presented with respect to these and other technical challenges.

SUMMARY

The technologies disclosed herein provide functionality for protecting mirrors in an LBS display device. Through implementations of the disclosed technologies, mirrors in an LBS display device, such as MEMS mirrors, can be protected against signal overdrive, mechanical and electrical noise, and physical shock. Other technical benefits not specifically mentioned herein can also be realized through implementations of the disclosed subject matter.

In order to realize the technical benefits mentioned briefly above, and potentially others, an LBS display device includes a laser beam emitter configured to emit a laser beam. The LBS display device also includes a mirror control system that includes a driver configured to generate a driving signal for controlling a mirror, such as a MEMS mirror. The mirror is configured to reflect the laser beam onto a display region to generate an image. In some embodiments, the LBS display device includes two mirrors, a fast-scan mirror that scans under resonance and a slow-scan mirror that scans linearly.

The mirror control system also includes an output limiter configured to limit an amplitude of the driving signal provided to the mirror, or mirrors, to a threshold value, or values. In one implementation, the output limiter applies an output limitation function to the driving signal in order to limit the amplitude of the driving signal to values between a lower threshold and an upper threshold (referred to herein as a "bounded range"). The output limitation function is smoothed in some embodiments disclosed herein to prevent abrupt transitions in the driving signal.

The output limiter might be implemented as hardware, software, or a combination of hardware and software. For instance, in one embodiment the output limiter provides an amplitude-limited output to an input of the driver. In another embodiment, the output limiter receives the driving signal from the driver and provides an amplitude-limited output to a mirror. In yet another embodiment, the output limiter is implemented in a controller. For example, the output limiter might be implemented as hardware or in software (e.g. firmware) within the controller. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

It should be appreciated that any reference to "first," "second," etc. items within the disclosure presented herein is not intended to and should not be construed as necessarily corresponding to any reference of "first," "second," etc. elements of the claims. In particular, within this Summary and/or the following Detailed Description, items may be distinguished by numerical designations without such designations corresponding to the claims or even other paragraphs of the Summary and/or Detailed Description.

DETAILED DESCRIPTION

Figure 1:
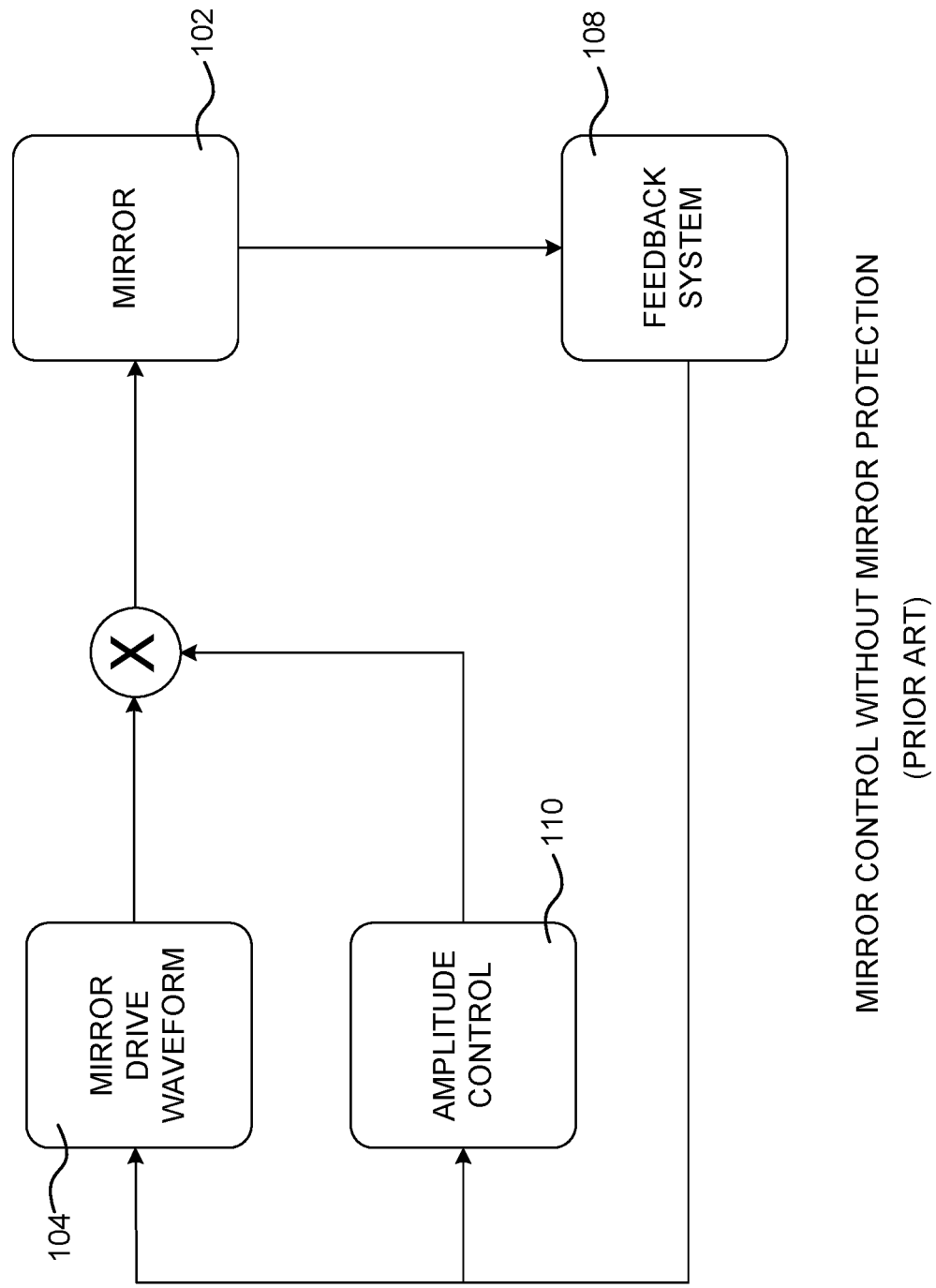
FIG. 1 shows an illustrative configuration of a mirror control system for an LBS display device that does not provide mirror protection.

The following detailed description is directed to technologies for protecting mirrors in an LBS display device. Through implementations of the disclosed technologies, mirrors in an LBS display device, such as MEMS mirrors, can be protected against signal overdrive, mechanical and electrical noise, and physical shock. Other technical benefits not specifically mentioned herein can also be realized through implementations of the disclosed subject matter.

In the following detailed description, references are made to the accompanying drawings that form a part hereof, and which are shown by way of illustration specific configurations or examples. Referring now to the drawings, in which like numerals represent like elements throughout the several FIGS., aspects of various technologies for protecting mirrors in an LBS display device will be described.

FIG. 1 shows an illustrative configuration of a mirror control system for an LBS display device that does not provide mirror protection. As discussed briefly above, LBS display devices form displayed images by using one or more mirrors 102, such as MEMS mirrors, to direct a laser beam onto a display region. In such display devices, a mirror drive waveform 104 causes a mirror 102 to move over the course of a frame to control the location in the display region toward which the laser beam is directed.

As also described briefly above, mirrors 102 used by LBS display devices are susceptible to electrical noise, mechanical noise, and physical shock that can damage the mirrors 102 in certain circumstances. Additionally, a mirror control system, such as that shown in FIG. 1, might overdrive mirrors 102 to meet certain control targets. This is particularly true for slow-scan mirrors, as they require a feedback system 108 to suppress the natural resonance of the mirror 102 and quickly correct for external disturbances. As an unintended consequence of these processes, however, the feedback system 108 and the associated amplitude control 110 might overdrive a mirror 102, which can force the mirror 102 into very high angles or very fast acceleration and damage the mirror 102.

Mirror control systems might also overdrive a mirror 102 during startup of a LBS display device. For example, a mirror control system including an amplitude control 110 might drive a mirror 102 to its maximum allowable-acceleration in order to realize a fast start of an LBS display device. During this process, the mirror control system outputs a mirror drive waveform 104 having the largest possible amplitude. This, however, can overdrive a mirror 102 past its maximum allowable displacement, thereby damaging the mirror 102. Overdriving a mirror 102 during startup of an LBS display device is illustrated in further detail below with respect to FIG. 2.

Figure 2:
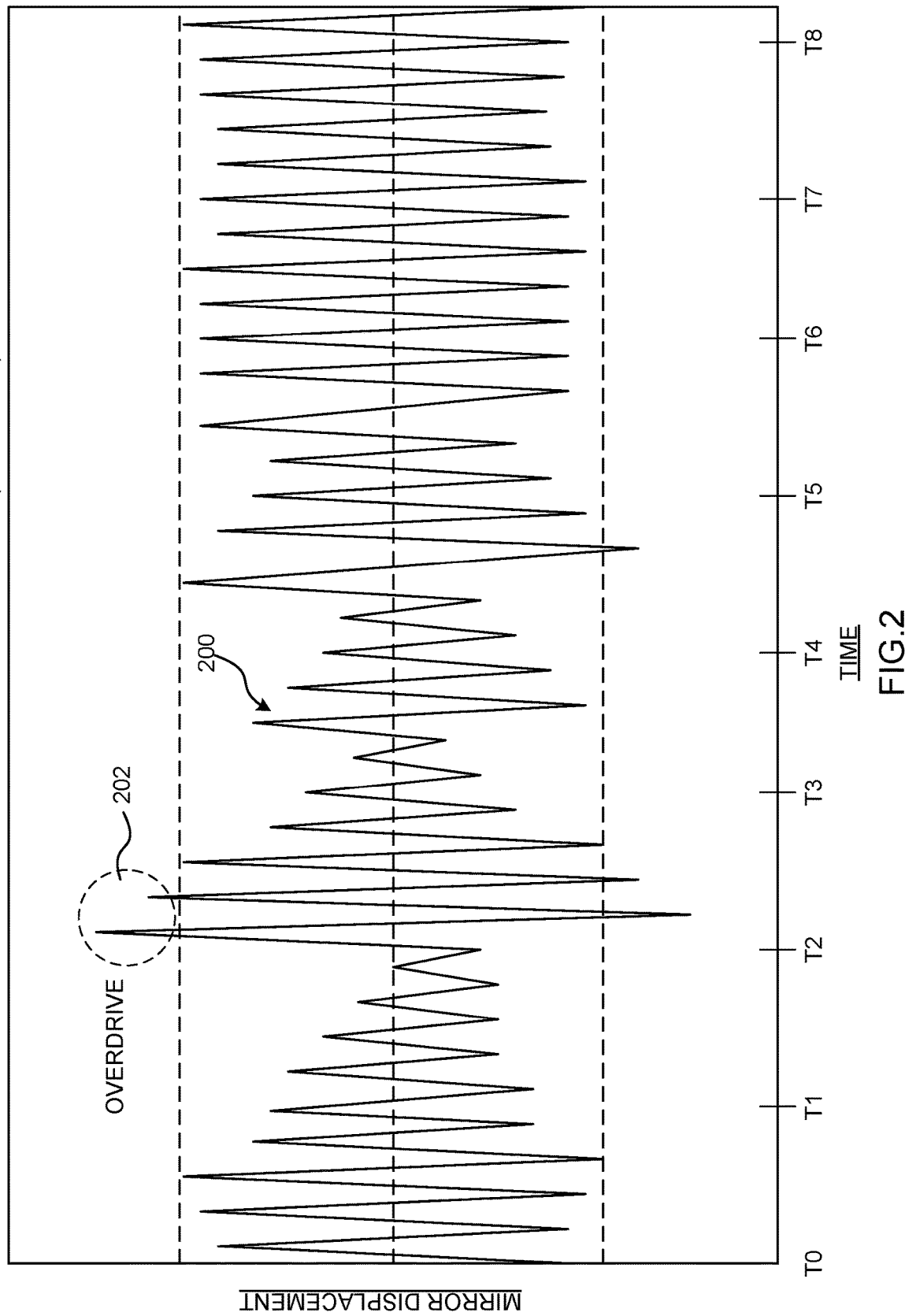
FIG. 2 is a waveform diagram showing the displacement of a mirror during startup of an LBS display device that does not provide mirror protection.

FIG. 2 is a waveform diagram showing a waveform 200 that illustrates the displacement of a mirror 102 during startup of an LBS display device that does not provide mirror protection. In particular, the waveform 200 represents the magnitude of the displacement of a mirror 102 in the LBS display device over time.

As shown in FIG. 2, and described briefly above, a mirror 102 can be driven to its maximum allowable acceleration in order to provide a fast startup of a LBS display device. In the example shown in FIG. 2, however, the amplitude control 110 has overdriven the mirror 102, thereby causing the mirror 102 to move past its maximum allowable displacement. The portion of the waveform 200 in the circular area 202 illustrates the movement of the mirror 102 past its maximum allowable displacement. The technologies described below for protecting mirrors in a LBS display device are presented with respect to these and other technical challenges.

Figure 3A:
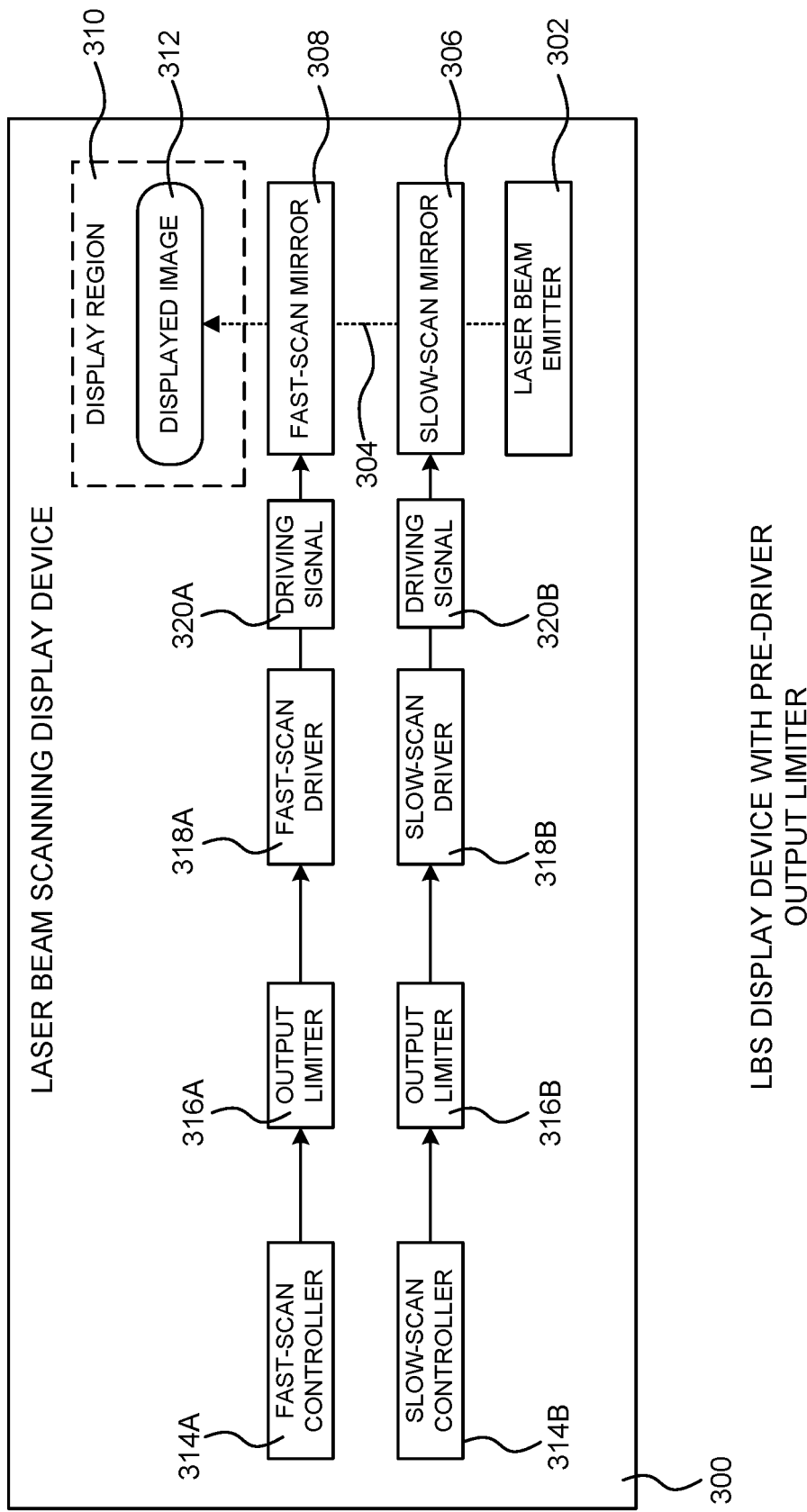
FIG. 3A is a device configuration diagram that illustrates aspects of the configuration of an LBS display device that provides functionality for protecting a MEMS mirror, according to one embodiment disclosed herein.
Figure 3B:
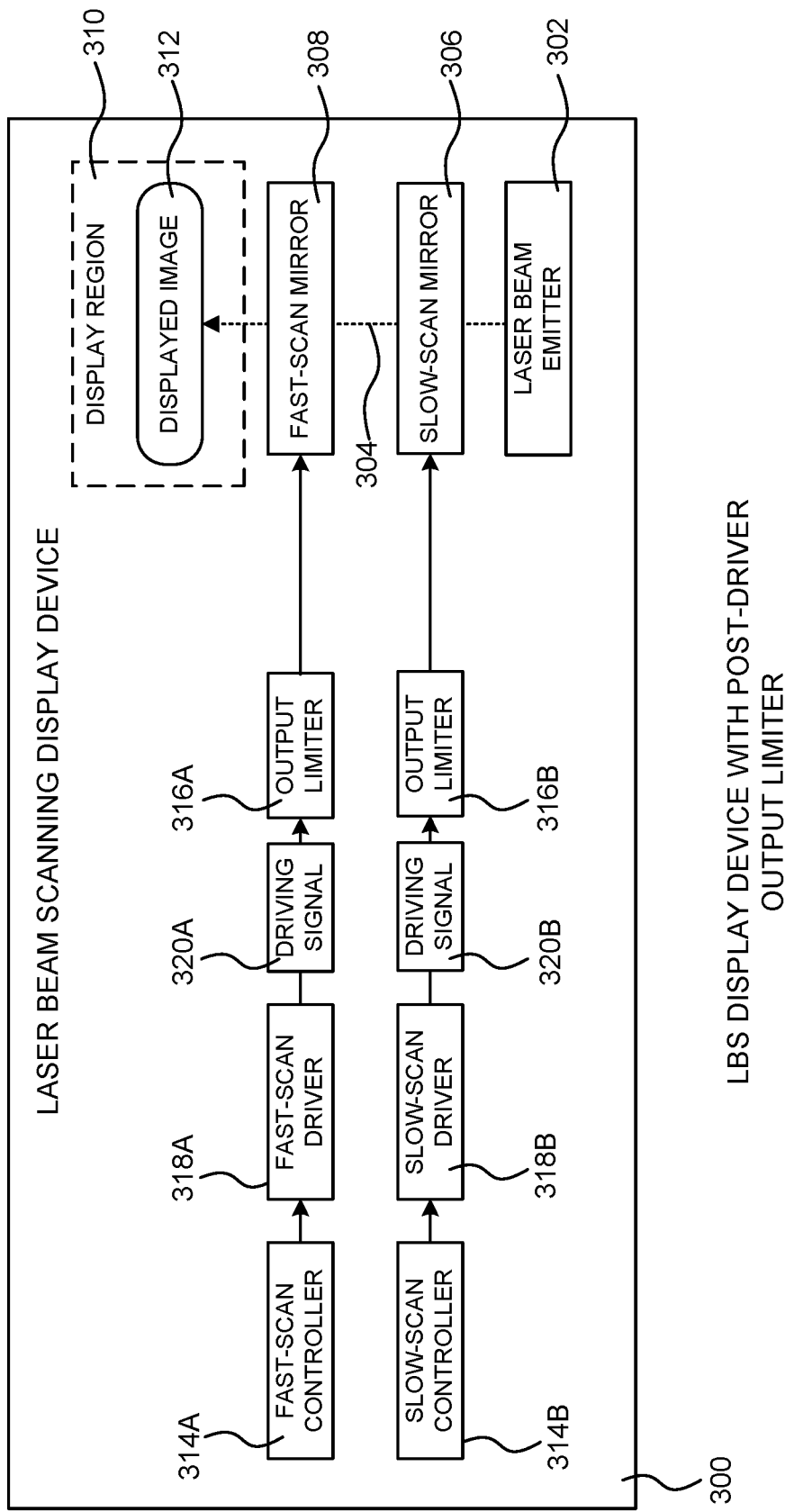
FIG. 3B is a device configuration diagram that illustrates aspects of the configuration of an LBS display device that provides functionality for protecting a MEMS mirror, according to another embodiment disclosed herein.
Figure 3C:
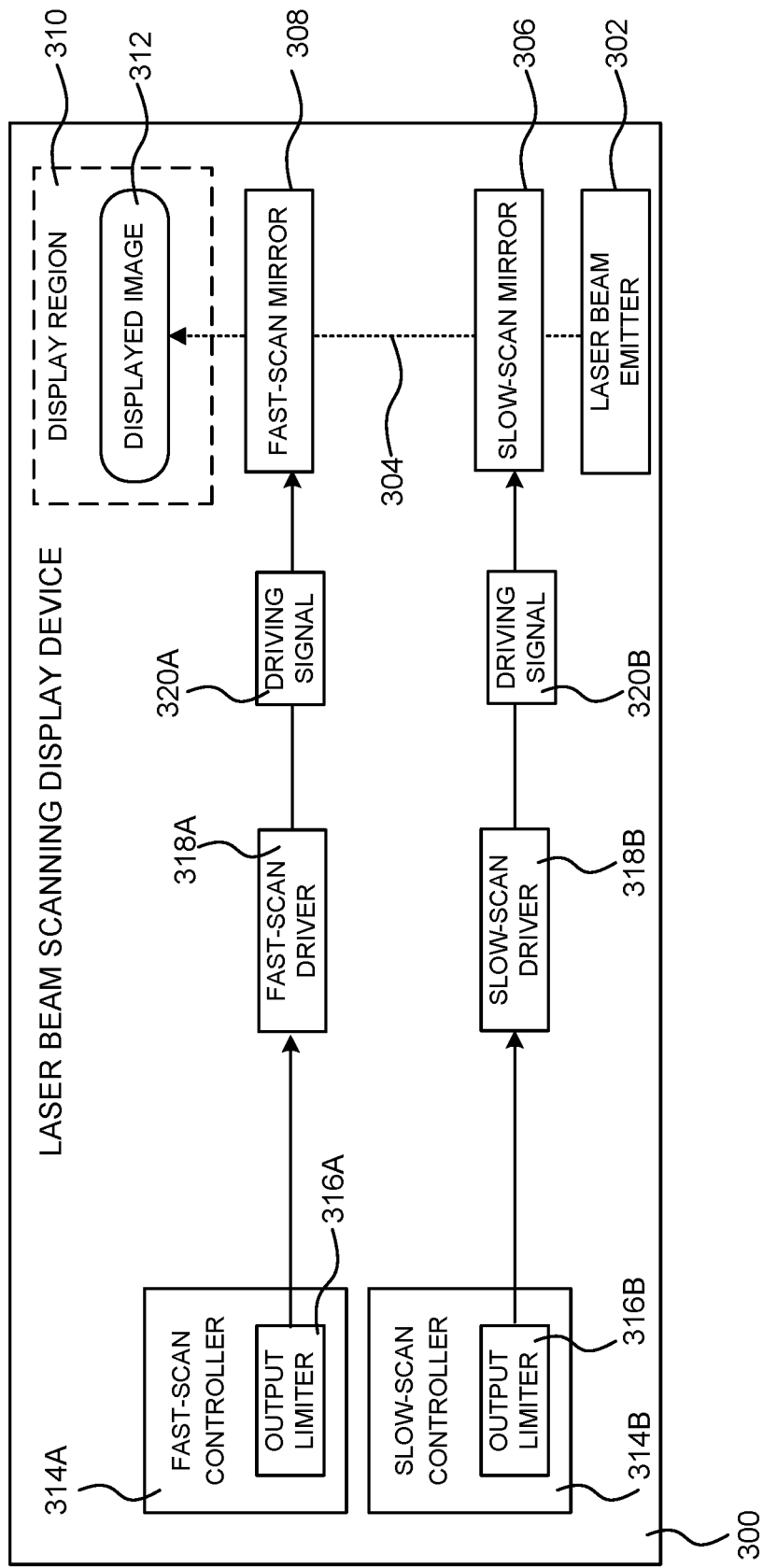
FIG. 3C is a device configuration diagram that illustrates aspects of the configuration of an LBS display device that provides functionality for protecting a MEMS mirror, according to yet another embodiment disclosed herein.

FIGS. 3A-3C are device configuration diagrams that illustrate several configurations of an LBS display device 300 that includes functionality for protecting mirrors contained therein, such as MEMS mirrors. In order to realize the technical benefits mentioned briefly above, and potentially others, the LBS display device 300 includes a laser beam emitter 302 configured to emit a laser beam 304. For example, the laser beam emitter 302 may be a laser diode.

The laser beam 304 may impinge upon a display region 310 of the LBS display device 300 to form a displayed image 312. For example, the display region 310 may be a display of a head-mounted display device and the displayed image 312 may include one or more virtual objects.

The illustrative LBS display device 300 also includes two mirrors: a slow-scan mirror 306 and a fast-scan mirror 308. The mirrors 306 and 308 are MEMS mirrors in one embodiment.

The slow-scan mirror 306 and the fast-scan mirror 308 may be configured to reflect the laser beam 304 onto the display region 310. The displayed image 312 may be displayed in one or more frames in which the slow-scan mirror 306 and the fast-scan mirror 308 direct the laser beam 304 across the display region 310 to "draw" the displayed image 312.

In some embodiments, the slow-scan mirror 306 is configured to complete a slow-scan period during each frame. The slow-scan period may include a display interval. The slow-scan mirror 306 may linearly scan across the display region 310 from an initial scanning position to a final scanning position. The laser beam emitter 302 may be configured to emit the laser beam 302 during the display interval. In the display interval, the fast-scan mirror 308 may perform multiple scans across the display region 310 to "draw" the displayed image 312.

The slow-scan period may further include anon-display interval. During the non-display interval, the slow-scan mirror 306 may be configured to return from the final scanning position to the initial scanning position. This portion of the non-display interval may also be referred to as "the flyback."

During the non-display interval, the laser beam emitter 304 may be configured to not emit the laser beam 304. In some embodiments, the display region 310 may include one or more blank regions in which the displayed image 312 is not displayed. In addition to the flyback, the non-display interval may include time during which the slow-scan minor 306 is oriented toward the one or more blank regions. The initial scanning position and the final scanning position may be located in the one or more blank regions.

The fast-scan mirror 308 may be driven by a driving signal 320A generated by a fast-scan driver 318A. A fast-scan controller 314A generates an output for controlling the operation of the fast-scan driver 318A. Similarly, the slow-scan mirror 306 can be driven by a driving signal 320B generated by a linear slow-scan driver 318B. A slow-scan controller 314B generates an output for controlling the operation of the slow-scan driver 318B. A single controller might be utilized to control both the fast-scan driver 318A and the slow-scan driver 318B in other configurations.

In order to limit the driving signals 320A and 320B such that the mirrors 306 and 308 are not overdriven (i.e. driven beyond limits that might damage the mirrors), the LBS display device 300 can be configured with one or more output limiters 316. The output limiters 316A and 316B are configured to limit an amplitude of the driving signals 320A and 320B provided to the minors 306 and 308 to a bounded range. As will be described in greater detail below, the output limiters 316 can be implemented in hardware (e.g. a voltage or current limiter or resistor-transistor logic) in software (e.g. within firmware or hardened digital logic executed by the controllers 314), or in combinations of hardware and software.

In the embodiment shown in FIG. 3A, the output limiters 316 are located prior to the drivers 318 in the signal path. In particular, the output limiter 316A limits the amplitude of the driving signal 320A and provides an amplitude-limited output to an input of the fast-scan driver 318A. Similarly, the output limiter 316B limits the driving signal 320B and provides an amplitude-limited output to an input of the slow-scan driver 318B.

FIG. 3B shows another embodiment of the LBS display device 300 in which the output limiters 316 are located after the drivers 318 in the signal path. In particular, the output limiter 316A receives the driving signal 320A from the fast-scan driver 318A and provides an amplitude-limited output to the fast-scan mirror 308. Similarly, the output limiter 316B receives the driving signal 320B from the slow-scan driver 318B and provides an amplitude-limited output to the slow-scan mirror 306.

In the embodiment shown in FIG. 3C, the output limiters 316A and 316B are implemented by the controllers 314A and 314B, respectively. As discussed above, the output limiters 316 can be implemented in the controllers 314A and 314B as hardware (e.g. resistor-transistor logic), software (e.g. within firmware or hardened digital logic executed by the controllers 314), or in combinations of hardware and software. Other configurations will be apparent to those skilled in the art.

Figure 4:
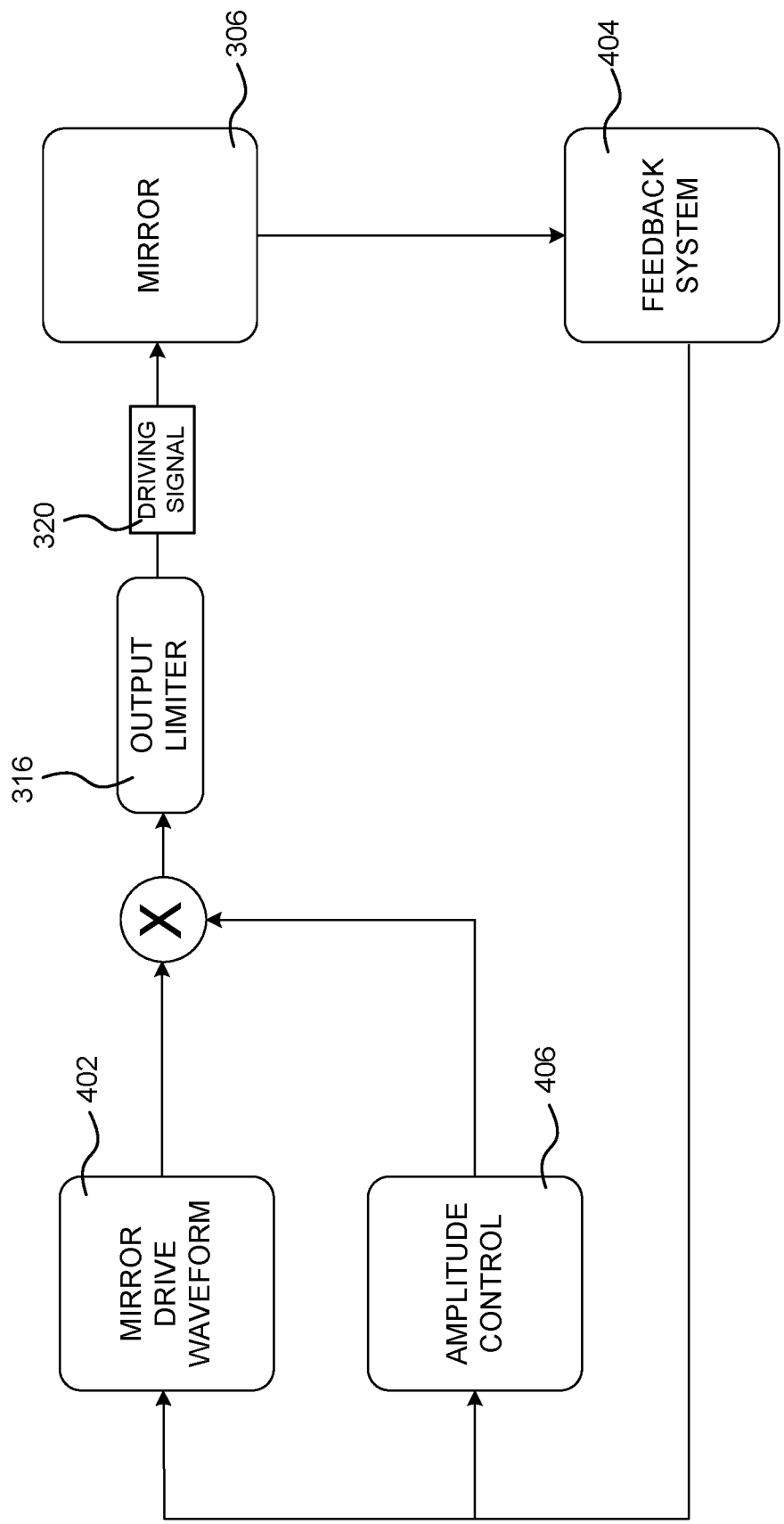
FIG. 4 is a schematic diagram showing an illustrative configuration of a mirror control system for an LBS display device that provides mirror protection.

FIG. 4 is a schematic diagram showing an illustrative configuration of a mirror control system for an LBS display device 300 that provides mirror protection. As discussed above, a feedback system 404 can obtain information describing the actual location of the mirror 306. In response thereto, the feedback system 404 can generate a mirror drive waveform 402 for driving the mirror 306. The mirror drive waveform 402 can be generated in a manner that reduces or eliminates resonance of the mirror 306, mechanical and electrical noise, and physical shock. The feedback system 404 also drives an amplitude control 406 that modifies the amplitude of the mirror drive waveform 402.

In order to limit the driving signal 320 such that the mirror 306 is not overdriven (i.e. driven beyond limits that might damage the mirror), the illustrated mirror control system can be configured with one or more output limiters 316 after the amplitude control 406. As discussed above, the output limiter 316 limits the amplitude of the driving signal 320 to a bounded range.

Figure 5:
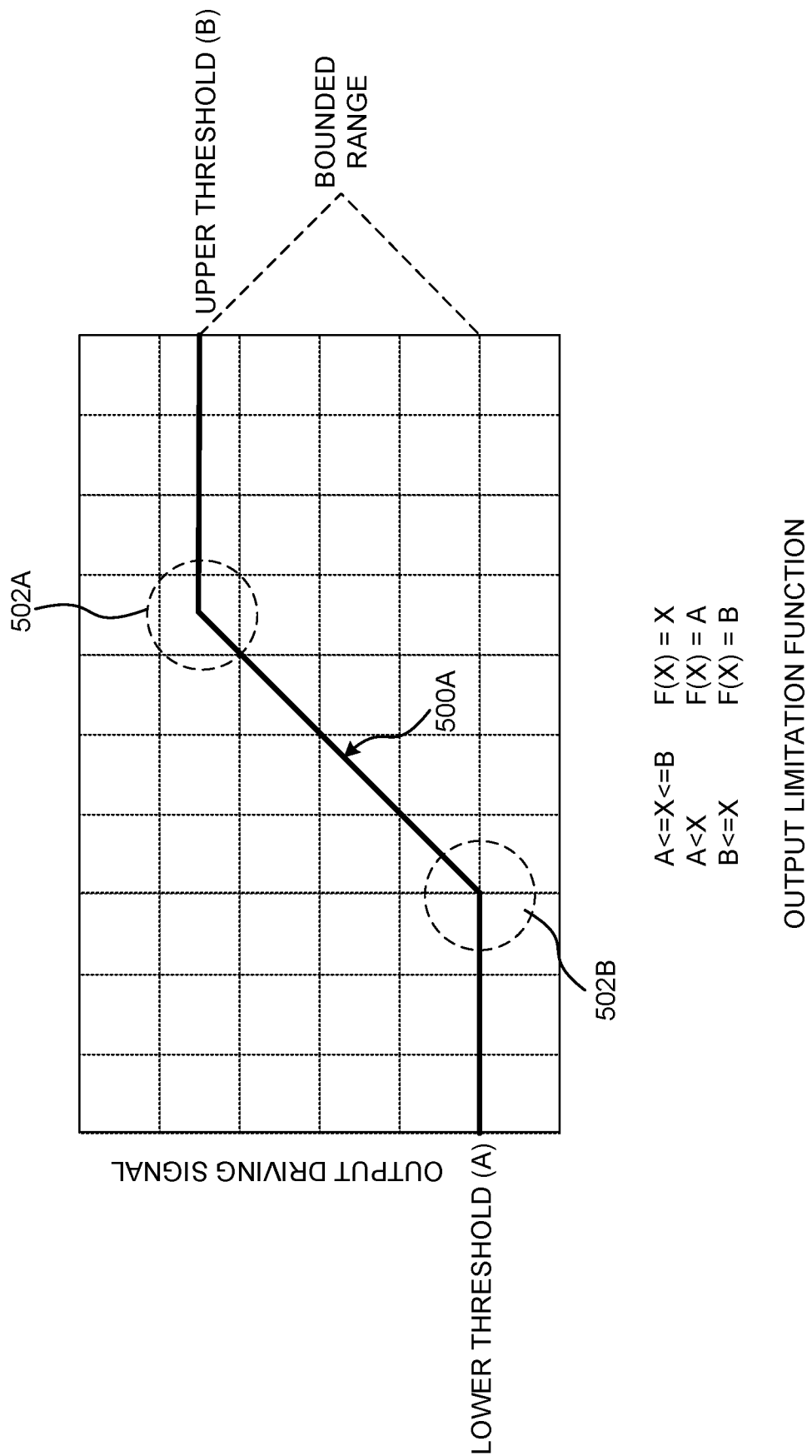
FIG. 5 is a graph diagram illustrating aspects of an output limitation function implemented by an output limiter to provide mirror protection, according to one embodiment disclosed herein.

FIG. 5 is a graph diagram illustrating aspects of an output limitation function 500A implemented by an output limiter 316 to provide mirror protection, according to one embodiment disclosed herein. In the illustrated example, a bounded range is defined between an upper threshold (B) and a lower threshold (A) for the amplitude of the driving signal 320B.

In the example output limitation function 500A shown in FIG. 5, the driving signal 320B is limited to the lower threshold (A) if the driving signal 320B exceeds the lower threshold (A). Similarly, the driving signal 320A is limited to the upper threshold (B) if the driving signal 320A exceeds the upper threshold (B). The driving signal 320A is unchanged while it remains less than or equal to the upper threshold (B) and greater than or equal to the lower threshold (A).

Utilization of the example output limitation function 500A shown in FIG. 5 can cause abrupt transitions when the driving signal 320A moves from a limited to a non-limited state. For instance, when the driving signal 320A moves from being limited to the lower threshold (A) to a value greater than the lower threshold (A), an abrupt transition occurs. This transition is shown within the dotted circle 502B shown in FIG. 5. Similarly, an abrupt transition also occurs when the driving signal 320A moves from being limited to the upper threshold (B) to a value lower than the upper threshold (B). This transition is shown within the dotted circle 502A shown in FIG. 5.

The abrupt transitions caused by the output limitation function 500A shown in FIG. 5 has many frequency components and, as a result, can lead to unwanted variations in the waveform of the driving signal 320. These unwanted variations are abnormal movements and may shorten the lifetime of the mirror 306. The smoothed output limitation function 500B shown in FIG. 6 reduces or eliminates the effects of abrupt transitions between limited and non-limited states.

Figure 6:
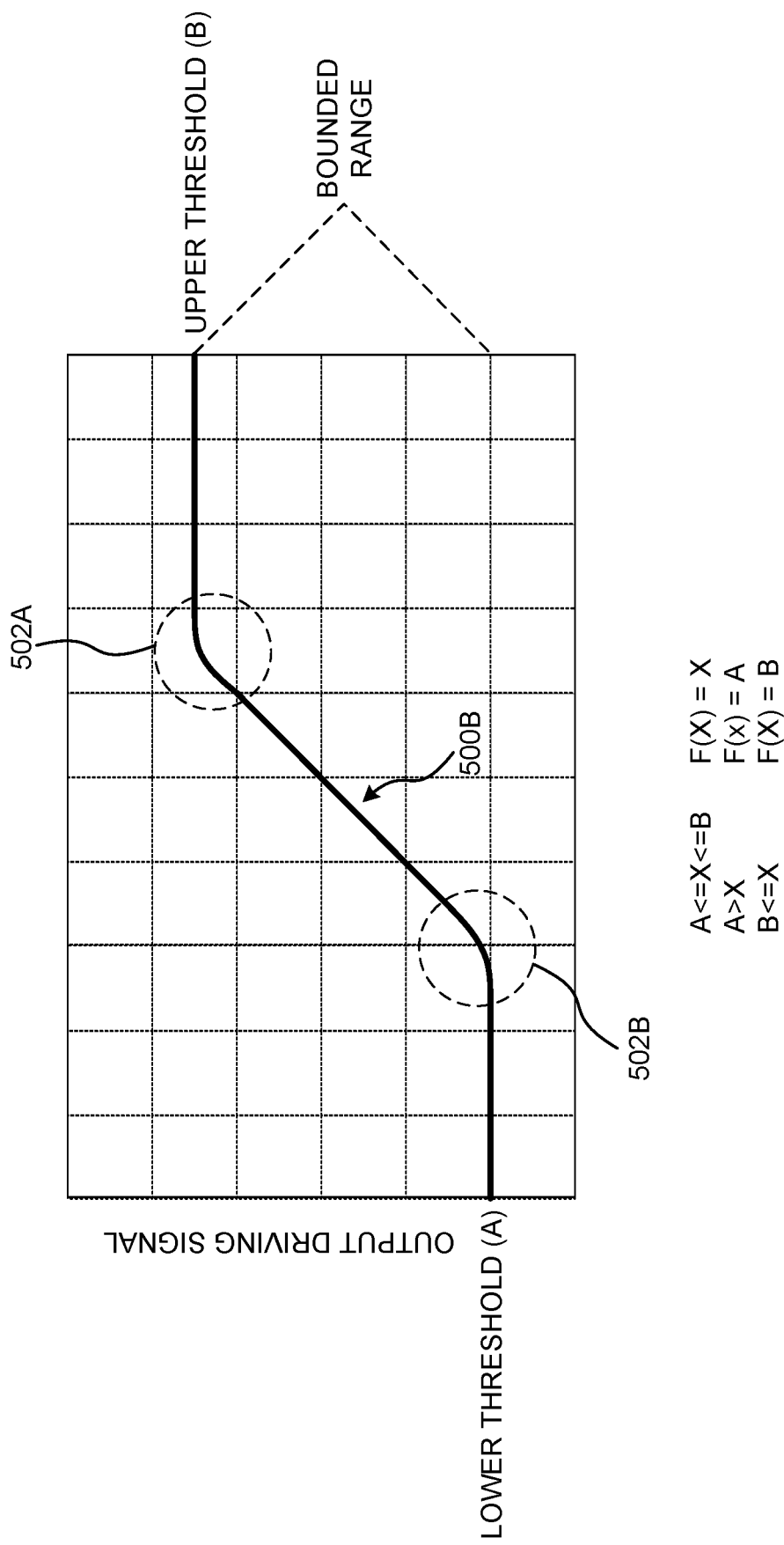
FIG. 6 is a graph diagram illustrating aspects of a smoothed output limitation function implemented by an output limiter to provide mirror protection, according to another embodiment disclosed herein.

FIG. 6 is a graph diagram illustrating aspects of a smoothed output limitation function 500B used to provide mirror protection, according to another embodiment disclosed herein. In this example, the smoothed output limitation function 500B operates in the same manner as the output limitation function 500A to limit the drive signal 320 to values between a bounded range between a lower threshold (A) and an upper threshold (B). However, the smoothed output limitation function 500B reduces or eliminates the effects of abrupt transitions between limited and non-limited states.

In order to reduce or eliminate the effects of abrupt transitions between limited and non-limited states, the smoothed output limitation function 500B provides a gradual (i.e. "smoothed") transition of the drive signal 320 from the limited state to a non-limited state. The smoothed transitions are shown within the dotted circles 502A and 502B shown in FIG. 6.

Figure 7:
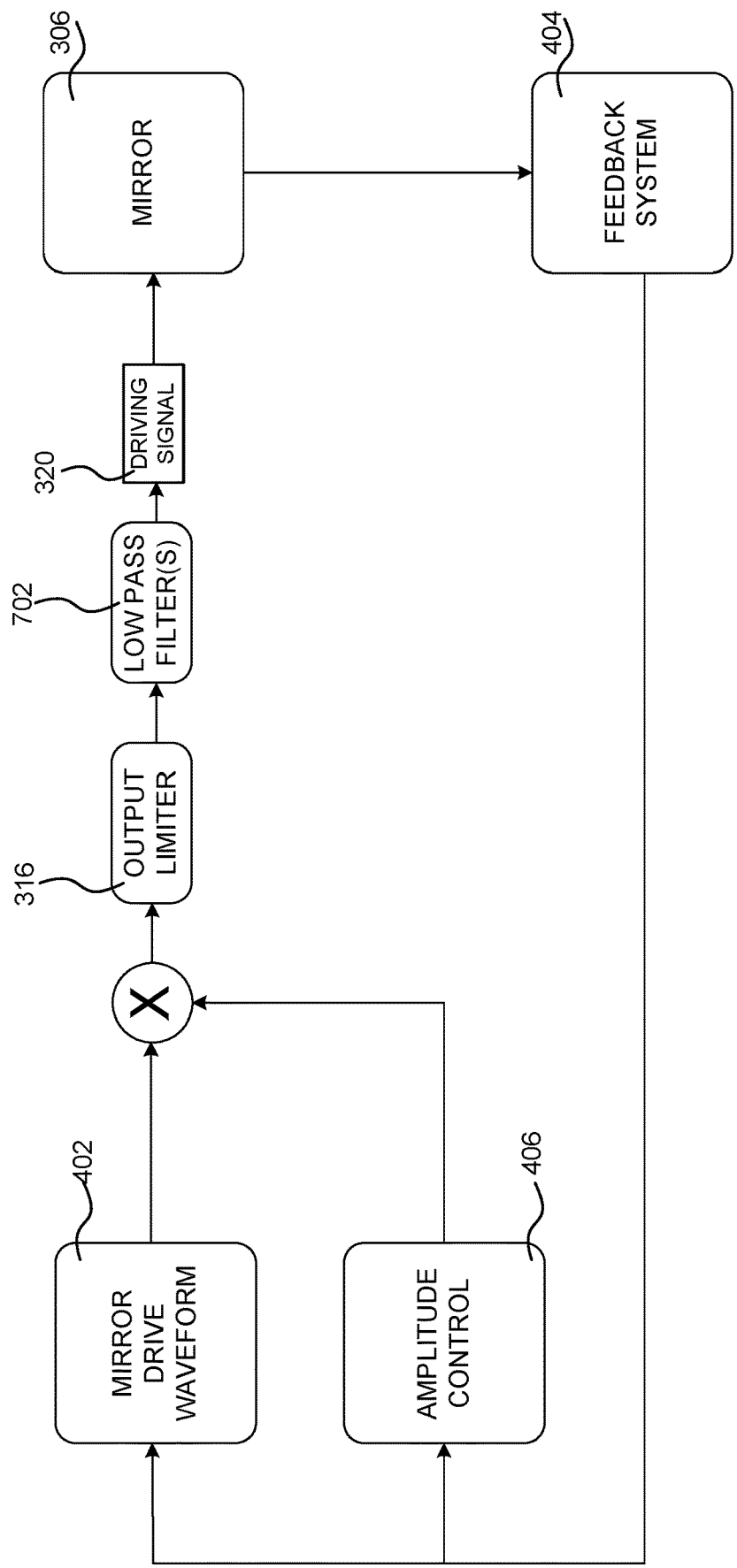
FIG. 7 is a schematic diagram showing an illustrative configuration of a mirror control system for an LBS display device that provides mirror protection using the output limitation function shown in FIG. 6.

In one embodiment, the smoothed output limitation function 500B is achieved by adding one or more low pass filters 702 (shown in FIG. 7) to the output of an output limiter 316. This results in a driving signal 320 that will not overdrive a mirror 306 and that will not generate unwanted variations in the driving signal 320 caused by abrupt transitions in the driving signal 320 caused by the output limitation function.

Figure 8:
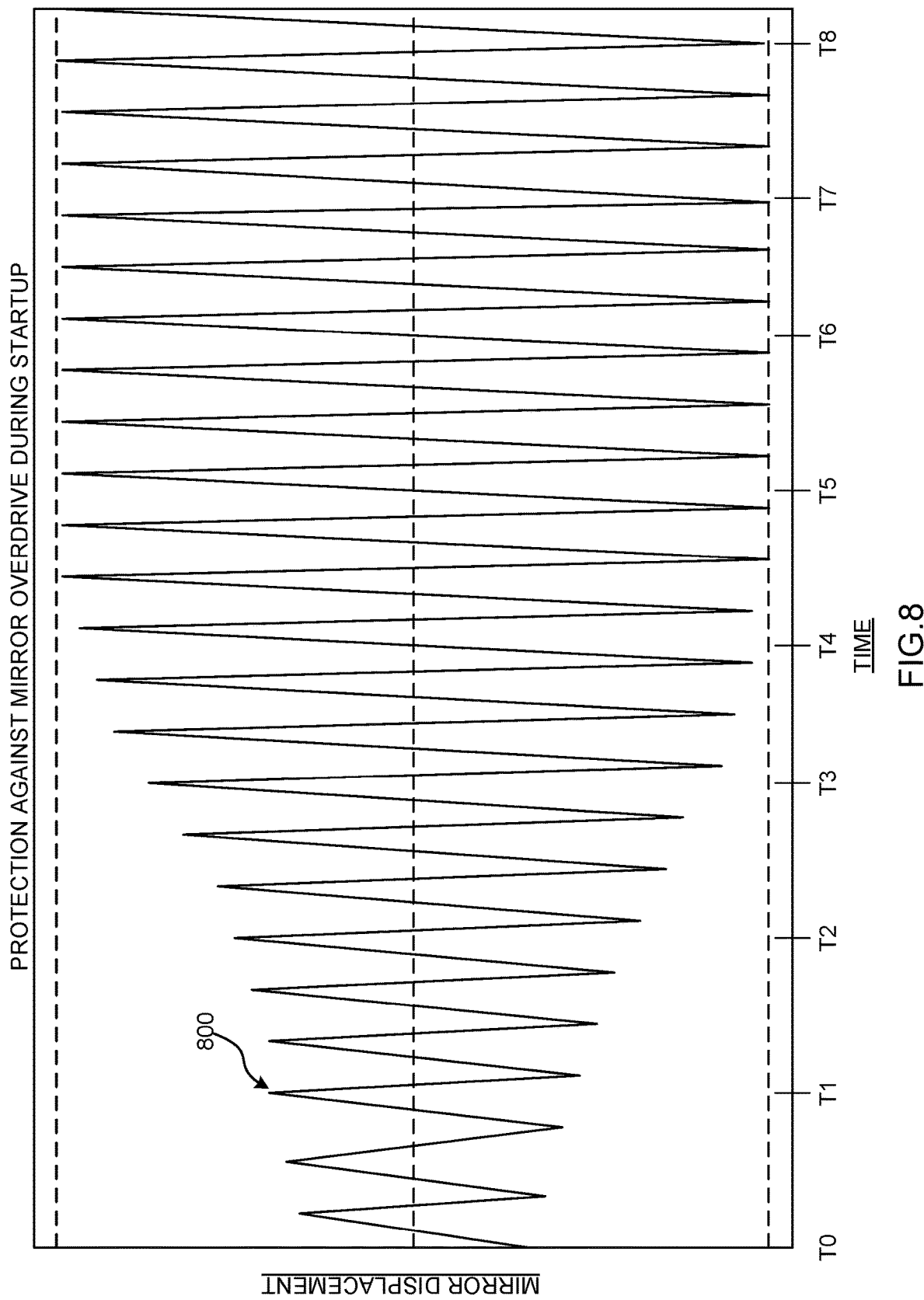
FIG. 8 is a waveform diagram showing the displacement of a mirror during startup of an LBS display device that provides mirror protection using the technologies disclosed herein.

FIG. 8 is a waveform diagram showing the displacement of a mirror during startup of an LBS display device 300 that provides mirror protection using the technologies disclosed herein. The waveform 800 represents the displacement of a mirror 306 in the LBS display device 300 over time.

In the example shown in FIG. 8, the smoothed output limitation function 500B enabled by the use of an output limiter 316 and one or more low pass filters 802 is used to limit the driving signal 320. As can be see, the smoothed output limitation function 500B results in a safe displacement of the mirror 306 during startup. No overdrive of the mirror 306 is observed and, therefore, the mirror 306 is well protected.

Figure 9:
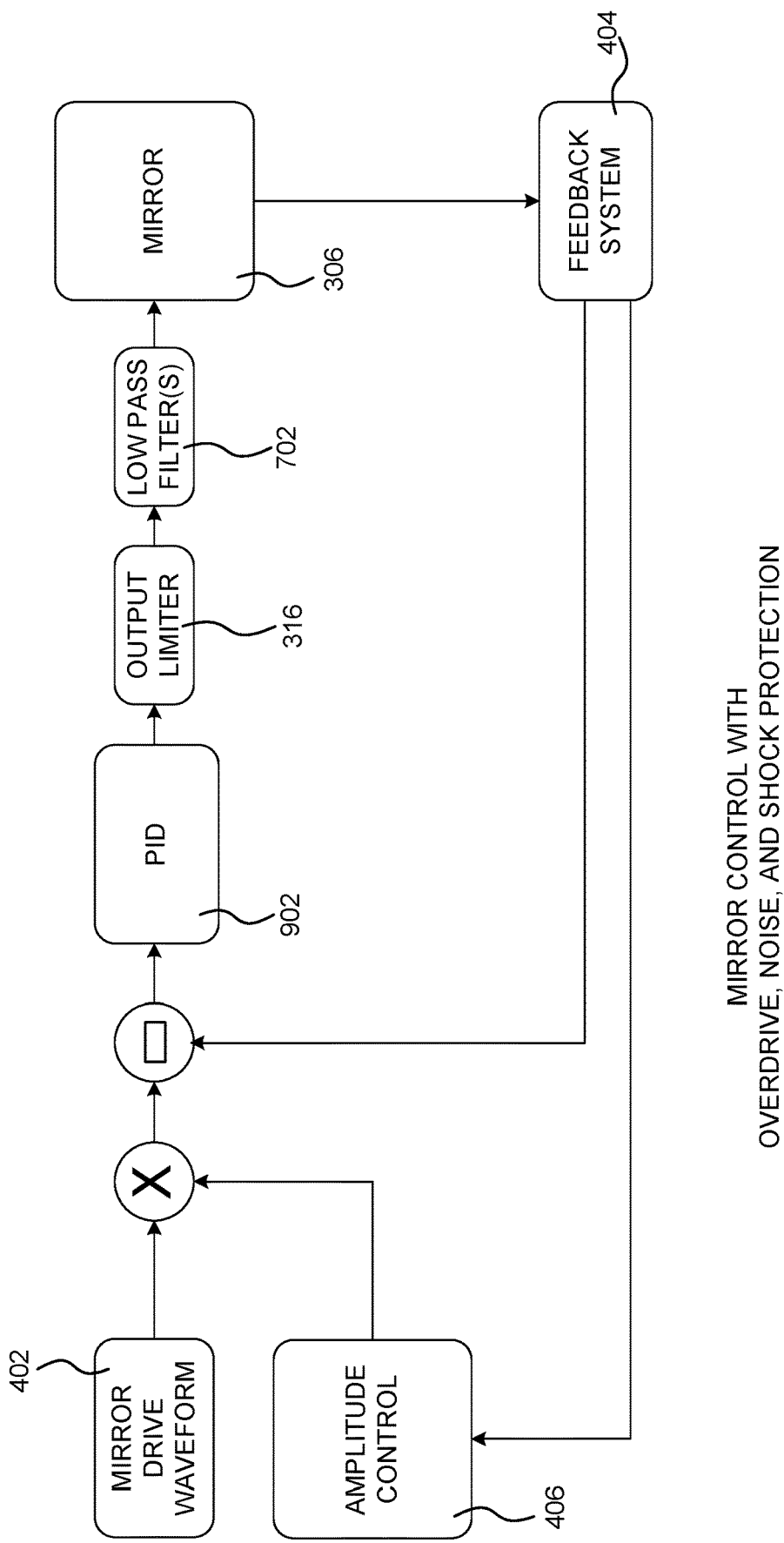
FIG. 9 is a schematic diagram showing an illustrative configuration of a mirror control system that can protect a mirror in an LBS display device against signal overdrive, mechanical and electrical noise, and physical shock, according to one embodiment disclosed herein.

FIG. 9 is a schematic diagram showing an illustrative configuration of a mirror control system that can protect a mirror in an LBS display device 300 against signal overdrive, mechanical and electrical noise, and physical shock, according to one embodiment disclosed herein. In this configuration, the actual movement of the mirror 306 as observed by the feedback system 404 is compared to the desired mirror drive waveform 402.

In the example shown in FIG. 9, an error signal that corresponds to the difference between the actual movement of the mirror 306 as observed by the feedback system 404 and the desired mirror drive waveform 402 is generated. This signal is then provided to a proportional-integral-derivative ("PID") controller 902. The PID controller 902, in turn, can generate a driving signal 320 that minimizes the error between the two signals. This will mitigate the impact on the movement of the mirror 306 caused by mechanical noise, electrical noise, and shock. Additionally, the output limiter 316 and the low pass filters 702 will eliminate the possibility that the mirror 306 is overdriven in the manner described herein. The mirror 306 is, as a result, protected from the possibility of mechanical damage.

Figure 10:
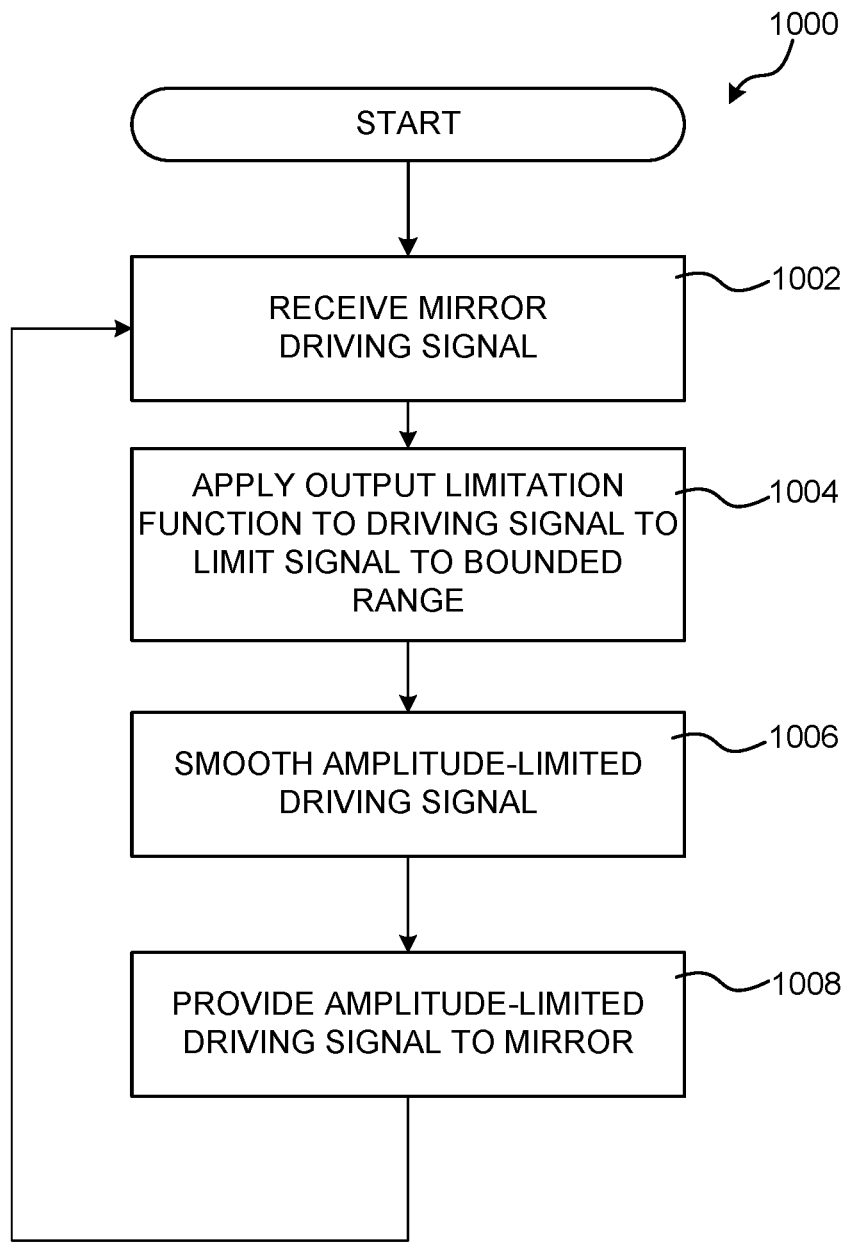
FIG. 10 is a flow diagram showing aspects of a routine for protecting a mirror in an LBS display device, according to one embodiment disclosed herein.

FIG. 10 is a flow diagram showing a routine 1000 that illustrates aspects of the operation of the output limiter 316, which was described above with reference to FIGS. 3A-9, according to one embodiment disclosed herein. It should be appreciated that the particular implementation of the technologies disclosed herein is a matter of choice dependent on the performance and other requirements of the computing device. Accordingly, the logical operations described herein are referred to variously as states, operations, structural devices, acts, or modules.

These states, operations, structural devices, acts and modules can be implemented in hardware, software, firmware, in special-purpose digital logic, and any combination thereof. It should be appreciated that more or fewer operations can be performed than shown in the FIGS. and described herein. These operations might also be performed in a different order than those described herein.

The routine 1000 begins at operation 1002, where an output limiter 316 receives the driving signal 320. The routine 1000 then proceeds from operation 1002 to operation 1004, where the output limiter 316 applies the output limitation function 500A to the driving signal 320. As discussed above, application of the output limitation function 500A to the driving signal 320 limits the amplitude of the driving signal 320 to values between a bounded range defined by an upper threshold and a lower threshold.

From operation 1004, the routine 1000 proceeds to operation 1006, where the amplitude-limited driving signal output by the output limiter 316 is smoothed in the manner described above with regard to FIGS. 6 and 7. As discussed above, one or more low pass filters 702 are utilized to smooth the amplitude-limited driving signal in some embodiments.

From operation 1006, the routine 1000 proceeds to operation 1008, where the amplitude-limited, and potentially smoothed, driving signal 320 is provided to the mirror 306. The routine 1000 then proceeds from operation 1008 back to operation 1002, where the process described above can be repeated to continually limit the amplitude of the driving signal 320.

Figure 11:
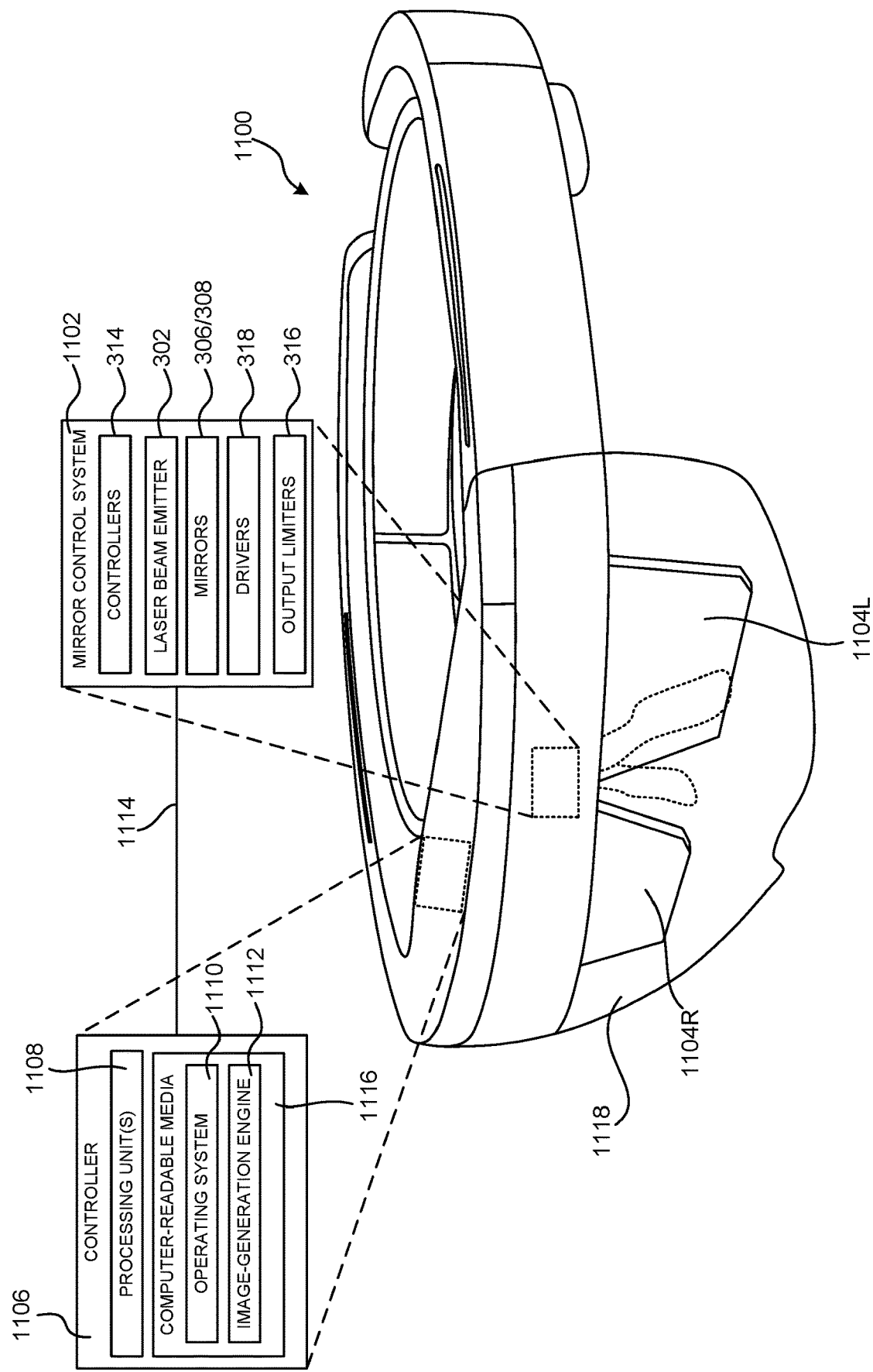
FIG. 11 shows aspects of the configuration of an illustrative near-eye display ("NED") device that includes a mirror control system implementing aspects of the technologies disclosed herein.

FIG. 11 shows aspects of the configuration of an illustrative near-eye display ("NED") device 1100 that includes a mirror control system 1102 implementing aspects of the technologies disclosed herein. The mirror control system 1102 includes the laser beam emitter 302, the mirrors 306 and 308, the drivers 318, the controllers 314, and output limiters 316. Each of these components was described in detail above with regard to FIGS. 3A-10.

In some examples, the NED device 1100 may utilize the mirror control system 1102 to generate a composite view (e.g., from a perspective of a user that is wearing the NED device 1100) that includes both one or more computer-generated ("CG") images and a view of at least a portion of the real-world environment 112 surrounding the NED device 1100. For example, the mirror control system 1102 may utilize various technologies such as, for example, augmented reality ("AR") technologies to generate composite views that include CG images superimposed over a real-world view. As such, the mirror control system 1102 may be configured to generate CG images via a display panel 1104.

In the illustrated example, the display panel 1104 includes separate right eye and left eye transparent display panels, labeled 1104R and 1104L, respectively. In some examples, the display panel 1104 may include a single transparent display panel that is viewable with both eyes and/or a single transparent display panel that is viewable by a single eye only.

It can be appreciated that the techniques described herein may be deployed within a single-eye NED device 1100 (e.g. GOOGLE GLASS) and/or a dual-eye NED device 1100 (e.g. MICROSOFT HOLOLENS). The NED device 1100 shown in FIG. 11 is an example device that is used to provide context and illustrate various features and aspects of the minor control system 1102 disclosed herein. Other devices and systems may also use the minor control system 1102 disclosed herein.

In some examples, the display panel 1104 may be a waveguide display that includes one or more diffractive optical elements ("DOEs") for in-coupling incident light into a waveguide, expanding the incident light in one or more directions for exit pupil expansion, and/or out-coupling the incident light out of the waveguide (e.g., toward a user's eye). In some examples, the NED device 1100 may further include an additional see-through optical component in the form of a transparent veil 1118 positioned between the real-world environment (which real-world environment makes up no part of the claimed invention) and the display panel 1104.

It can be appreciated that the transparent veil 1118 may be included in the NED device 1100 for purely aesthetic and/or protective purposes. The NED device 1100 may further include various other components, for example speakers, microphones, accelerometers, gyroscopes, magnetometers, temperature sensors, touch sensors, inertial measurement sensors, biometric sensors, other image sensors, energy-storage components (e.g. battery), a communication facility, a global positioning system ("GPS") receiver, etc.

In the illustrated example, a controller 1106 is operatively coupled to the mirror control system 1102. The controller 1106 includes one or more logic devices and one or more computer memory devices storing instructions executable by the logic device(s) to deploy aspects of the functionality described herein with relation to the mirror control system 1102. The controller 1106 and the mirror control system 1102 of the NED device 1100 are operatively connected, for example, via a bus 1114, which can include one or more of a system bus, a data bus, an address bus, a PCI bus, a Mini-PCI bus, and any variety of local, peripheral, and/or independent buses.

The controller 1106 can also include one or more processing units 1108. The processing unit(s) 1108, can represent, for example, a CPU-type processing unit, a GPU-type processing unit, a field-programmable gate array ("FPGA"), a digital signal processor ("DSP"), or other hardware logic components that may, in some instances, be driven by a CPU. For example, and without limitation, illustrative types of hardware logic components that can be used include Application-Specific Integrated Circuits ("ASICs"), Application-Specific Standard Products ("ASSPs"), System-on-a-Chip Systems ("SOCs"), Complex Programmable Logic Devices ("CPLDs"), etc.

The controller 1106 can also include one or more computer-readable media 1116 storing an operating system 1110 and data such as, for example, image data that defines one or more CG images for presentation by the NED device 1100. The computer-readable media 1116 may further include an image-generation engine 1112 that generates output signals to control aspects of the operation of the mirror control system 1102 to present the CG images.

As used herein, computer-readable media, such as computer-readable media 1116, can store instructions executable by the processing units 1108. The computer-readable media 1116 can also store instructions executable by external processing units such as by an external CPU, an external GPU, and/or executable by an external accelerator, such as an FPGA type accelerator, a DSP type accelerator, or any other internal or external accelerator. In various examples, at least one CPU, GPU, and/or accelerator is incorporated in the NED device 1100, while in some examples one or more of a CPU, GPU, and/or accelerator are external to the NED device 1100.

As used herein, the term computer-readable media can include computer storage media and/or communication media. Computer storage media can include one or more of volatile memory, nonvolatile memory, and/or other persistent and/or auxiliary computer storage media, removable and non-removable computer storage media implemented in any method or technology for storage of information such as computer-readable instructions, data structures, program modules, or other data.

Thus, computer storage media includes tangible and/or physical forms of media included in a device and/or hardware component that is part of a device or external to a device, including but not limited to random access memory ("RAM"), static random-access memory ("SRAM"), dynamic random-access memory ("DRAM"), phase change memory ("PCM"), read-only memory ("ROM"), erasable programmable read-only memory ("EPROM"), electrically erasable programmable read-only memory ("EEPROM"), flash memory, rotating media, optical cards or other optical storage media, magnetic storage, magnetic cards or other magnetic storage devices or media, solid-state memory devices, storage arrays, network attached storage, storage area networks, hosted computer storage or any other storage memory, storage device, and/or storage medium that can be used to store and maintain information for access by a computing device in a non-transitory fashion.

In contrast to computer storage media, communication media can embody computer-readable instructions, data structures, program modules, or other data in a modulated data signal, such as a carrier wave, or other transmission mechanism. As defined herein, computer storage media does not include communication media. That is, computer storage media does not include communications media consisting solely of a modulated data signal, a carrier wave, or a propagated signal, per se.

Figure 12:
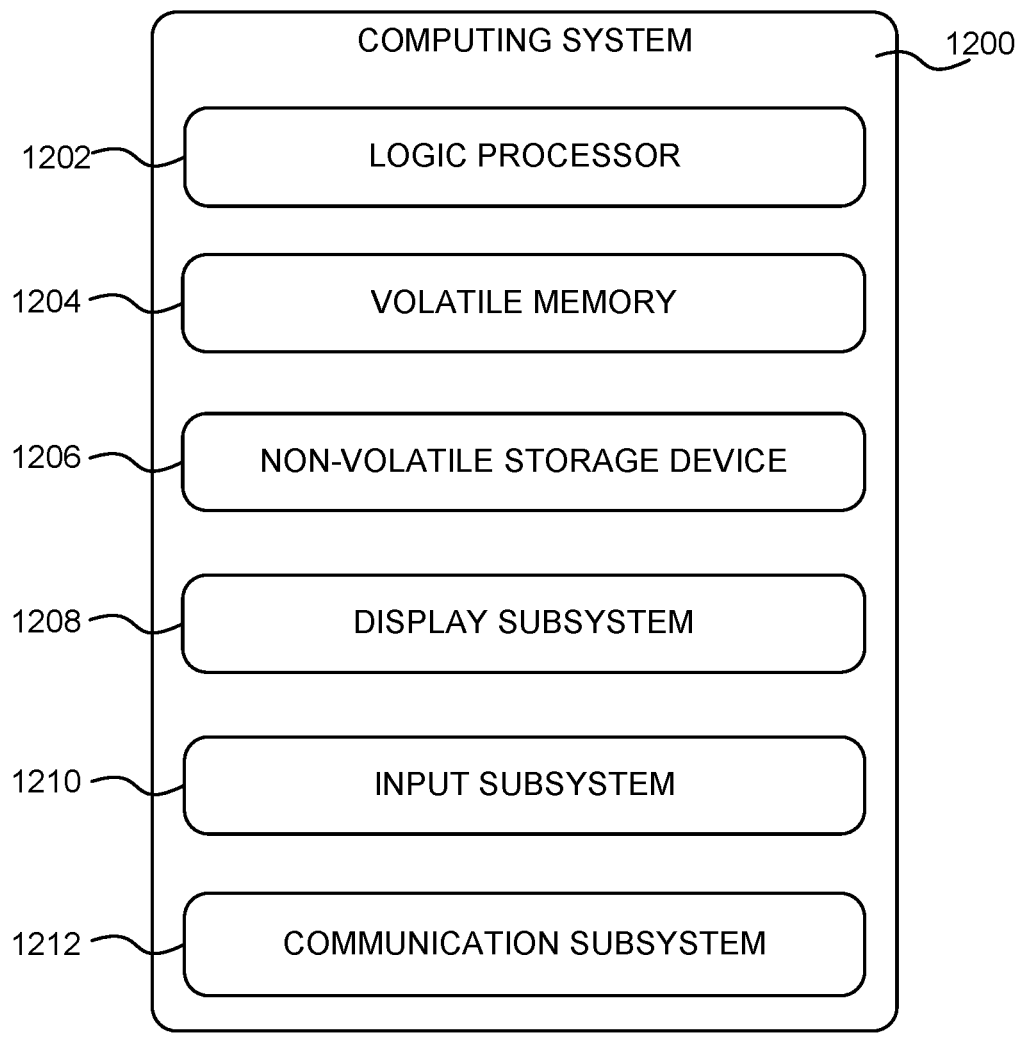
FIG. 12 shows a schematic view of an example computing environment in which aspects of the technologies disclosed herein can be implemented.

FIG. 12 shows a schematic view of an example computing environment in which aspects of the technologies disclosed herein can be implemented. In particular, FIG. 12 schematically shows a non-limiting embodiment of a computing system 1200 that can be used to implement the technologies disclosed herein. Computing system 1200 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 1200 includes a logic processor 1202 volatile memory 1204, and a non-volatile storage device 1206. Computing system 1200 may optionally include a display subsystem 1208, input subsystem 1210, communication subsystem 1212, and/or other components not shown in FIG. 12.

Logic processor 1202 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 1202 may include one or more physical processors (i.e. hardware) configured to execute software instructions. Additionally, or alternatively, the logic processor 1202 may include one or more hardware logic circuits or firmware devices configured to execute hardware-implemented logic or firmware instructions.

The logic processor 1202 may be single-core or multi-core, and the instructions executed thereon may be configured for sequential, parallel, and/or distributed processing. Individual components of the logic processor 1202 optionally may be distributed among two or more separate devices, which may be remotely located and/or configured for coordinated processing. Aspects of the operation of the logic processor 1202 may be virtualized and executed by remotely accessible, networked computing devices configured in a cloud-computing configuration. In such a case, these virtualized aspects are run on different physical logic processors of various different machines, it will be understood.

Non-volatile storage device 1206 includes one or more physical devices configured to hold instructions executable by the logic processors to implement aspects of the methods and processes described herein. When such methods and processes are implemented, the state of non-volatile storage device 1206 may be transformed—e.g., to hold different data.

Non-volatile storage device 1206 may include physical devices that are removable and/or built-in. Non-volatile storage device 1206 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1206 may include nonvolatile, dynamic, static, read/write, read-only, sequential-access, location-addressable, file-addressable, and/or content-addressable devices. It will be appreciated that non-volatile storage device 1206 is configured to hold instructions even when power is cut to the non-volatile storage device 1206.

Volatile memory 1204 may include physical devices that include random access memory. Volatile memory 1204 is typically utilized by logic processor 1202 to temporarily store information during processing of software instructions. It will be appreciated that volatile memory 1204 typically does not continue to store instructions when power is removed from the volatile memory 1204. Aspects of logic processor 1202, volatile memory 1204, and non-volatile storage device 1206 may be integrated together into one or more hardware-logic components, such as within an ASIC, SOC, or FPGA.

The terms "module," "program," and "engine" may be used to describe an aspect of computing system 1200 typically implemented in software by a processor 1202 to perform a particular function using portions of volatile memory 1204, which function involves transformative processing that specially configures the processor 1202 to perform the function. Thus, a module, program, or engine may be instantiated via logic processor 1202 executing instructions held by non-volatile storage device 1206, using portions of volatile memory 1204.

It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 1208 may be used to present a visual representation of data held by non-volatile storage device 1206. The visual representation may take the form of a graphical user interface ("GUI"). As the herein described methods and processes change the data held by the non-volatile storage device, and thus transform the state of the non-volatile storage device, the state of display subsystem 1208 may likewise be transformed to visually represent changes in the underlying data. Display subsystem 1208 may include one or more display devices utilizing virtually any type of technology, such as the LBS display devices disclosed herein. Such display devices may be combined with logic processor 1202, volatile memory 1204, and/or non-volatile storage device 1206 in a shared enclosure, or such display devices may be peripheral display devices.

When included, input subsystem 1210 may comprise or interface with one or more user-input devices such as a keyboard, mouse, touch screen, or game controller. In some embodiments, the input subsystem may comprise or interface with selected natural user input ("NUI") componentry. Such componentry may be integrated or peripheral, and the transduction and/or processing of input actions may be handled on- or off-board.

Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 1212 may be configured to communicatively couple various computing devices described herein with each other, and with other devices. Communication subsystem 1212 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 1200 to send and/or receive messages to and/or from other devices via a network such as the Internet.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The disclosure presented herein also encompasses the subject matter set forth in the following clauses:

Clause 1. A display device, comprising: a laser beam emitter configured to emit a laser beam; a driver configured to generate a driving signal for controlling a microelectromechanical systems (MEMS) mirror, the MEMS mirror configured to reflect the laser beam onto a display region to generate an image; and an output limiter configured to receive the driving signal, generate an amplitude-limited driving signal by limiting an amplitude of the driving signal to a bounded range, and provide the amplitude-limited driving signal to the MEMS mirror.

Clause 2. The display device of clause 1, wherein the MEMS mirror comprises a slow-scan mirror.

Clause 3. The display device of any of clauses 1 or 2, wherein the MEMS mirror comprises a fast-scan mirror.

Clause 4. The display device of any of clauses 1-3, wherein the output limiter is configured to provide an output to an input of the driver.

Clause 5. The display device of any of clauses 1-4, wherein the driver is configured to provide the driving signal to an input of the output limiter.

Clause 6. The display device of any of clauses 1-5, further comprising a controller comprising the output limiter.

Clause 7. The display device of any of clauses 1-6, wherein the output limiter comprises a software output limiter.

Clause 8. The display device of any of clauses 1-7, wherein the output limiter comprises a hardware output limiter.

Clause 9. A display device comprising: a laser beam emitter configured to emit a laser beam; a first microelectromechanical systems (MEMS) mirror; a second MEMS mirror; a first driver configured to generate a first driving signal for controlling the first MEMS mirror a second driver configured to generate a second driving signal for controlling the second MEMS mirror, wherein the first driver and the second driver are configured to drive the first MEMS mirror and the second MEMS mirror respectively to reflect the laser beam onto a display region to generate an image; a first output limiter configured to limit an amplitude of the first driving signal to a bounded range; and a second output limiter configured to limit an amplitude of the second driving signal to the bounded range.

Clause 10. The display device of clause 9, wherein the first MEMS mirror comprises a slow-scan mirror and wherein the second MEMS mirror comprises a fast-scan mirror.

Clause 11. The display device of any of clauses 9 or 10, wherein the first output limiter is configured to provide an output to an input of the first driver and wherein the second output limiter is configured to provide an output to an input of the second driver.

Clause 12. The display device of any of clauses 9-11, wherein the first driver is configured to provide the first driving signal to an input of the first output limiter and wherein the second driver is configured to provide the second driving signal to an input of the second output limiter.

Clause 13. The display device of any of clauses 9-12, further comprising one or more controllers comprising the first output limiter and the second output limiter.

Clause 14. The display device of any of clauses 9-13, further comprising one or more first low pass filters connected to an output of the first output limiter for smoothing the first driving signal and one or more second low pass filters connected to an output of the second output limiter for smoothing the second driving signal.

Clause 15. A display device comprising: a laser beam emitter configured to emit a laser beam; a slow-scan microelectromechanical systems (MEMS) mirror; a slow-scan driver configured to generate a driving signal for controlling the slow-scan MEMS mirror; and a controller configured to control the driving signal to limit an amplitude of the driving signal to a bounded range.

Clause 16. The display device of clause 15, further comprising: a fast-scan MEMS mirror; a fast-scan driver configured to generate a driving signal for controlling the fast-scan MEMS mirror; and a second controller configured to control the driving signal for controlling the fast-scan MEMS mirror to limit an amplitude of the driving signal for controlling the fast-scan MEMS mirror to the bounded range.

Clause 17. The display device of any of clauses 15 or 16, wherein the controller is configured to provide an output to an input of the slow-scan driver.

Clause 18. The display device of any of clauses 15-17, wherein the controller is further configured to smooth the driving signal.

Clause 19. The display device of any of clauses 15-18, wherein the driving signal is smoothed by one or more low pass filters.

Clause 20. The display device of any of clauses 15-19, wherein the controller is implemented in software or hardware.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device, comprising:
a laser beam emitter configured to emit a laser beam;
a driver configured to generate a driving signal for controlling a microelectromechanical systems (MEMS) mirror, the MEMS mirror configured to reflect the laser beam onto a display region to generate an image; and
an output limiter configured to receive the driving signal, generate an amplitude-limited driving signal by limiting an amplitude of the driving signal to a bounded range, and provide the amplitude-limited driving signal to the MEMS mirror.

2. The display device of claim 1, wherein the MEMS mirror comprises a slow-scan mirror.

3. The display device of claim 1, wherein the MEMS mirror comprises a fast-scan mirror.

4. The display device of claim 1, wherein the output limiter is configured to provide an output to an input of the driver.

5. The display device of claim 1, wherein the driver is configured to provide the driving signal to an input of the output limiter.

6. The display device of claim 1, further comprising a controller comprising the output limiter.

7. The display device of claim 6, wherein the output limiter comprises a software output limiter.

8. The display device of claim 6, wherein the output limiter comprises a hardware output limiter.

9. A display device comprising:
a laser beam emitter configured to emit a laser beam;
a first microelectromechanical systems (MEMS) mirror;
a second MEMS minor;
a first driver configured to generate a first driving signal for controlling the first MEMS mirror;
a second driver configured to generate a second driving signal for controlling the second MEMS mirror, wherein the first driver and the second driver are configured to drive the first MEMS minor and the second MEMS mirror respectively to reflect the laser beam onto a display region to generate an image;
a first output limiter configured to limit an amplitude of the first driving signal to a bounded range; and
a second output limiter configured to limit an amplitude of the second driving signal to the bounded range.

10. The display device of claim 9, wherein the first MEMS mirror comprises a slow-scan mirror and wherein the second MEMS mirror comprises a fast-scan mirror.

11. The display device of claim 9, wherein the first output limiter is configured to provide an output to an input of the first driver and wherein the second output limiter is configured to provide an output to an input of the second driver.

12. The display device of claim 9, wherein the first driver is configured to provide the first driving signal to an input of the first output limiter and wherein the second driver is configured to provide the second driving signal to an input of the second output limiter.

13. The display device of claim 9, further comprising one or more controllers comprising the first output limiter and the second output limiter.

14. The display device of claim 9, further comprising one or more first low pass filters connected to an output of the first output limiter for smoothing the first driving signal and one or more second low pass filters connected to an output of the second output limiter for smoothing the second driving signal.

15. A display device comprising:
 a laser beam emitter configured to emit a laser beam;
 a slow-scan microelectromechanical systems (MEMS) mirror;
 a slow-scan driver configured to generate a driving signal for controlling the slow-scan MEMS mirror; and
 a controller configured to control the driving signal to limit an amplitude of the driving signal to a bounded range.

16. The display device of claim 15, further comprising:
 a fast-scan MEMS mirror;
 a fast-scan driver configured to generate a driving signal for controlling the fast-scan MEMS mirror; and
 a second controller configured to control the driving signal for controlling the fast-scan MEMS mirror to limit an amplitude of the driving signal for controlling the fast-scan MEMS mirror to the bounded range.

17. The display device of claim 16, wherein the controller is implemented in software or hardware.

18. The display device of claim 15, wherein the controller is configured to provide an output to an input of the slow-scan driver.

19. The display device of claim 15, wherein the controller is further configured to smooth the driving signal.

20. The display device of claim 15, wherein the driving signal is smoothed by one or more low pass filters.

* * * * *